United States Patent
Shi et al.

(10) Patent No.: US 9,328,971 B2
(45) Date of Patent: May 3, 2016

(54) LIQUID COOLING SYSTEM AND METHOD FOR COOLING AT LEAST ONE RADIO UNIT

(71) Applicant: HUAWEI TECHNOLOGIES CO., LTD., Shenzhen (CN)

(72) Inventors: Jian Shi, Shanghai (CN); Bjorn Gudmundsson, Kista (SE); Wangjun Wu, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 526 days.

(21) Appl. No.: 13/731,457

(22) Filed: Dec. 31, 2012

(65) Prior Publication Data

US 2013/0213605 A1 Aug. 22, 2013

Related U.S. Application Data

(63) Continuation of application No. PCT/EP2012/052900, filed on Feb. 21, 2012.

(51) Int. Cl.
*H01L 23/473* (2006.01)
*F28F 9/00* (2006.01)
*H04B 1/036* (2006.01)
*H05K 7/20* (2006.01)

(52) U.S. Cl.
CPC ............... *F28F 9/00* (2013.01); *H01L 23/473* (2013.01); *H04B 1/036* (2013.01); *H05K 7/20218* (2013.01); *H01L 2924/0002* (2013.01); *H05K 7/20254* (2013.01)

(58) Field of Classification Search
CPC .......................... H01L 23/473; H05K 7/20254
USPC .................. 165/80.4, 104.19; 361/699
See application file for complete search history.

(56) References Cited

U.S. PATENT DOCUMENTS 2,708,833 A * 5/1955 Nigro ............................. 62/262
2,849,523 A * 8/1958 Narbut ......................... 174/15.1
(Continued)

FOREIGN PATENT DOCUMENTS

CN 202103764 1/2012
JP 2010-78229 4/2010
(Continued)

OTHER PUBLICATIONS

International Search Report mailed Nov. 26, 2012 for corresponding International Application No. PCT/EP2012/052900.
(Continued)

*Primary Examiner* — Allen Flanigan
(74) *Attorney, Agent, or Firm* — Staas & Halsey LLP

(57) ABSTRACT

The invention relates to a liquid cooling system comprising a cooling unit and a liquid loop in which the liquid is arranged to be conveyed from a supply outlet of the cooling unit to a radio unit where the liquid is arranged to cool the radio unit before being conveyed back in the liquid loop to a return inlet of the cooling unit, the cooling unit being arranged located at a distance from the radio unit, wherein the cooling unit is an expandable cooling unit comprising a secondary outlet and a secondary inlet where, when an additional cooling unit of the liquid cooling system is connected with an inlet to said secondary outlet and with an outlet to said secondary inlet, the liquid is arranged to be fed from the cooling unit through the secondary outlet to the additional cooling unit arranged to also cool the liquid.

25 Claims, 5 Drawing Sheets

(56) References Cited

U.S. PATENT DOCUMENTS

| | | | |
|---|---|---|---|
| 3,638,672 A * | 2/1972 | Smith et al. | 137/813 |
| 5,144,531 A | 9/1992 | Go et al. | |
| 5,148,863 A * | 9/1992 | Fouts et al. | 165/149 |
| 5,457,603 A | 10/1995 | Leeb | |
| 5,522,452 A * | 6/1996 | Mizuno et al. | 165/286 |
| 5,923,533 A * | 7/1999 | Olson | 361/699 |
| 6,019,167 A | 2/2000 | Bishop et al. | |
| 6,094,929 A | 8/2000 | Eriksson | |
| 6,754,076 B2 * | 6/2004 | Cox et al. | 361/699 |
| 7,355,852 B2 | 4/2008 | Pfahnl | |
| 7,808,783 B2 * | 10/2010 | Goth et al. | 361/700 |
| 2005/0200001 A1 | 9/2005 | Joshi et al. | |
| 2006/0067047 A1 | 3/2006 | Pfahnl | |
| 2007/0256815 A1 * | 11/2007 | Conway et al. | 165/80.4 |
| 2010/0293987 A1 * | 11/2010 | Horst et al. | 62/440 |

FOREIGN PATENT DOCUMENTS

| | | |
|---|---|---|
| WO | 99/60709 | 11/1999 |
| WO | 02/37914 | 5/2002 |

OTHER PUBLICATIONS

Written Opinion of the International Searching Authority mailed Nov. 26, 2012 for corresponding International Application No. PCT/EP2012/052900.

Chinese Office Action dated Apr. 3, 2015 in corresponding Chinese Patent Application No. 201280070237.6.

Chinese Search Report dated Mar. 25, 2015 in corresponding Chinese Patent Application No. 2012800702376.

* cited by examiner

LIQUID COOLING SYSTEM AND METHOD FOR COOLING AT LEAST ONE RADIO UNIT

CROSS-REFERENCE TO RELATED APPLICATIONS

This application is a continuation of International Application No. PCT/EP2012/052900, filed on Feb. 21, 2012, which is hereby incorporated by reference in its entirety.

TECHNICAL FIELD

The present invention relates to a liquid cooling system for cooling at least one radio unit. The invention also relates to a method for cooling at least one radio unit.

BACKGROUND OF THE INVENTION

Cooling systems are used for cooling purposes in different applications, such as e.g. for cooling radio transceiver units in telecom equipment, etc.

A component to be cooled such as a PCB or a power amplifier may be cooled using a heat sink by placing the component to be cooled against the heat sink base in order to be able to transfer heat from the component to the heat sink.

If more cooling power is needed, it is possible to arrange forced cooling of the heat sink, i.e. to arrange a fan that forces a flow of air across the surfaces of the heat sink cooling fins thereby replacing the air around the cooling fins which air has been heated by the heat from the cooling fins with cooler ambient air from the outside of the heat sink.

Normally, radio units, e.g. radio transceivers, are installed on top of a tower or at a similar high mounting position. As the efficiency of e.g. power amplifiers in radio units is not 100%, they emit heat, i.e. the radio unit comprises heat generating components whereby the radio unit needs to be cooled. As mentioned above, one possibility is to cool the radio unit by using traditional air cooled heat sinks with fans for forced convection cooling or without fans for so called natural convection cooling.

Due to the often limited base area of a heat generating component in a radio unit and the desire to place more and more functionality on a defined base area of a component, more powerful components are developed. This increase in component capacity may e.g. be accomplished by building higher integration components. This increase in component capacity leads to that more power may be fed to components per component base area than before which in turn results in that the components emit more heat per base area than before when in maximum use e.g. during peak traffic in telecom systems, i.e. the maximum heat load of components is increasing as they may be fed with more power per square centimetre (W/cm$^2$) base area. This is also the case for e.g. power amplifiers in radio units. Need of increased performance from radio units means increased heat dissipation, which in turn means need of increased cooling performance. For radio units with heat sinks for natural convection cooling there is increasing difficulties as these have to be of such dimensions that their size and weight results in the need for stronger mountings and reinforcement of e.g. towers and very large sizes that are not accepted on the market. Radio units may be cooled with forced convection with some apparatus, which can force air through a heat sink, e.g. by using fans.

When forced cooling with air of a heat sink placed with its base against the component, such as an power amplifier in a radio unit in a tower, to be cooled is insufficient or requires heat sinks of very large dimensions to cool the components, other methods may be used such as liquid cooling.

U.S. Pat. No. 6,094,929 shows remote cooling of radio transceivers, e.g. by using liquid cooling.

U.S. Pat. No. 7,355,852 B2 shows modular liquid cooling of electronic assemblies.

SUMMARY OF THE INVENTION

The object of the present invention is to provide an improved liquid cooling system for cooling at least one radio unit and an improved method for cooling at least one radio unit.

The object is achieved by arranging a liquid cooling system for cooling at least one radio unit using liquid, where the liquid cooling system comprises a cooling unit arranged to cool the liquid and further comprises a liquid loop in which the liquid is arranged to be conveyed from a supply outlet of the cooling unit to the at least one radio unit where the liquid is arranged to cool the at least one radio unit before being conveyed back in the liquid loop to a return inlet of the cooling unit, the cooling unit being arranged located at a distance from the at least one radio unit, where the cooling unit is an expandable cooling unit comprising a secondary outlet and a secondary inlet where, when an additional cooling unit of the liquid cooling system is connected with an inlet to said secondary outlet and with an outlet to said secondary inlet, the liquid is arranged to be fed from the cooling unit through the secondary outlet to the additional cooling unit arranged to also cool the liquid and thereafter fed back to the cooling unit through the secondary inlet.

The object is further achieved by a method for cooling at least one radio unit using a liquid cooling system comprising a cooling unit arranged located at a distance from the at least one radio unit and further comprising a liquid loop, comprising the steps of cooling the liquid using the liquid cooling unit, conveying the cooled liquid in the liquid loop from a supply outlet of the cooling unit to the at least one radio unit, cooling the at least one radio unit using the cooled liquid, conveying back the liquid in the liquid loop from the at least one radio unit to a return inlet of the cooling unit, further comprising the steps of arranging the cooling unit with a secondary outlet and a secondary inlet, connecting an additional cooling unit of the liquid cooling system with an inlet to said secondary outlet and with an outlet to said secondary inlet, feeding the liquid from the cooling unit through the secondary outlet to the additional cooling unit, cooling the liquid in the additional cooling unit, and feeding back the liquid to the cooling unit through the secondary inlet.

By arranging a liquid cooling system for cooling at least one radio unit using liquid with an expandable cooling unit comprising a secondary outlet and a secondary inlet where, when an additional cooling unit of the liquid cooling system is connected with an inlet to said secondary outlet and with an outlet to said secondary inlet, the liquid is arranged to be fed from the cooling unit through the secondary outlet to the additional cooling unit arranged to also cool the liquid and thereafter fed back to the cooling unit through the secondary inlet, the liquid cooling system may be easily adapted to changes in the heat load of and especially for more heat load in the radio units, e.g. if radio units are replaced with radio units having higher heat load of if additional radio units are added to be cooled by the liquid cooling system it is easy to add more cooling power to the liquid cooling system by adding an additional cooling unit to the system.

By arranging the additional cooling unit to be of the same type as the cooling unit, any number of additional cooling units may be easily added to the system in a very flexible way depending on the increase of radio unit heat load.

By arranging a liquid cooling system for cooling several radio units with a respective constant fluid flow valve arranged in the liquid loop at the respective radio unit to be cooled by the liquid, differences on the cooling of the respective radio unit due to pressure drops in the loop for a radio unit arranged far away from the cooling unit compared to a radio unit arranged relatively close to the cooling unit is avoided whereby all radio units are able to receive the same cooling power independent of how far from each other or the cooling unit that they are placed.

According to one embodiment of the invention, the secondary outlet of the cooling unit is arranged upstream of the secondary inlet.

According to one embodiment of the invention, the liquid cooling system comprises a flow blocking device arranged in the cooling unit in a liquid flow pathway between the secondary outlet and the secondary inlet, wherein the flow blocking device is arranged to block said liquid flow pathway inside the cooling unit when said additional cooling unit is connected to said cooling unit, whereby the flow of liquid between the return inlet and the supply outlet of the cooling unit is arranged to bypass the flow blocking device via the additional cooling unit.

According to one embodiment of the invention, the additional cooling unit is an expandable cooling unit comprising a secondary outlet and a secondary inlet where, when a further additional cooling unit of the liquid cooling system is connected with an inlet to said secondary outlet and with an outlet to said secondary inlet, the liquid is arranged to be fed from the additional cooling unit through the secondary outlet to the further additional cooling unit arranged to also cool the liquid and thereafter fed back to the additional cooling unit through the secondary inlet.

According to one embodiment of the invention, the secondary outlet of the additional cooling unit is arranged upstream of the secondary inlet.

According to one embodiment of the invention, the liquid cooling system comprises a flow blocking device arranged in the additional cooling unit in a liquid flow pathway between the secondary outlet and the secondary inlet, wherein the flow blocking device is arranged to block said liquid flow pathway inside the additional cooling unit when said further additional cooling unit is connected to said additional cooling unit whereby the flow of liquid between the return inlet and the supply outlet of the cooling unit is arranged to bypass the flow blocking device via the further additional cooling unit.

According to one embodiment of the invention, the cooling unit comprises a liquid circulation device arranged to convey the liquid in the liquid loop.

According to one embodiment of the invention, the liquid circulation device is a pump unit, e.g. a centrifugal pump.

According to one embodiment of the invention, the additional cooling unit comprises a liquid circulation device arranged to convey the liquid in the liquid loop.

According to one embodiment of the invention, the additional cooling unit is of the same type as the cooling unit.

According to one embodiment of the invention, a respective constant fluid flow valve is arranged in the liquid loop at a respective radio unit to be cooled by the liquid.

According to one embodiment of the invention, the respective radio unit comprises a respective cold plate where the liquid is arranged in direct or indirect thermal contact with a heat generating part of the respective radio unit.

According to one embodiment of the invention, the heat generating part of the respective radio unit is a respective power amplifier.

According to one embodiment of the invention, a respective constant fluid flow valve is arranged at the inlet to the respective cold plate.

According to one embodiment of the invention, the liquid cooling system comprises respective radio unit pressure devices arranged in the liquid loop of the liquid cooling system upstream of the respective radio unit, where the respective radio unit pressure device is arranged to be able to block the flow of liquid to the respective radio unit when at the same time allowing air to enter the respective radio unit when a respective radio unit is to be replaced.

According to one embodiment of the invention, the liquid cooling system comprises a soft hose arranged as a part of the loop.

According to one embodiment of the invention, the liquid loop comprises a combined radio feeder and liquid cable for transport of both radio signals and liquid to the radio unit.

Further advantages of the invention will be apparent from the following detailed description.

BRIEF DESCRIPTION OF THE DRAWINGS

The appended drawings are intended to clarify and explain different embodiments of the present invention in which.

DETAILED DESCRIPTION OF THE INVENTION

In connection with this description, the word "liquid" refers to fluids such as e.g. water, glycol, etc. and mixtures of fluids such as e.g. a mixture comprising both water and glycol, etc.

Figure 1:
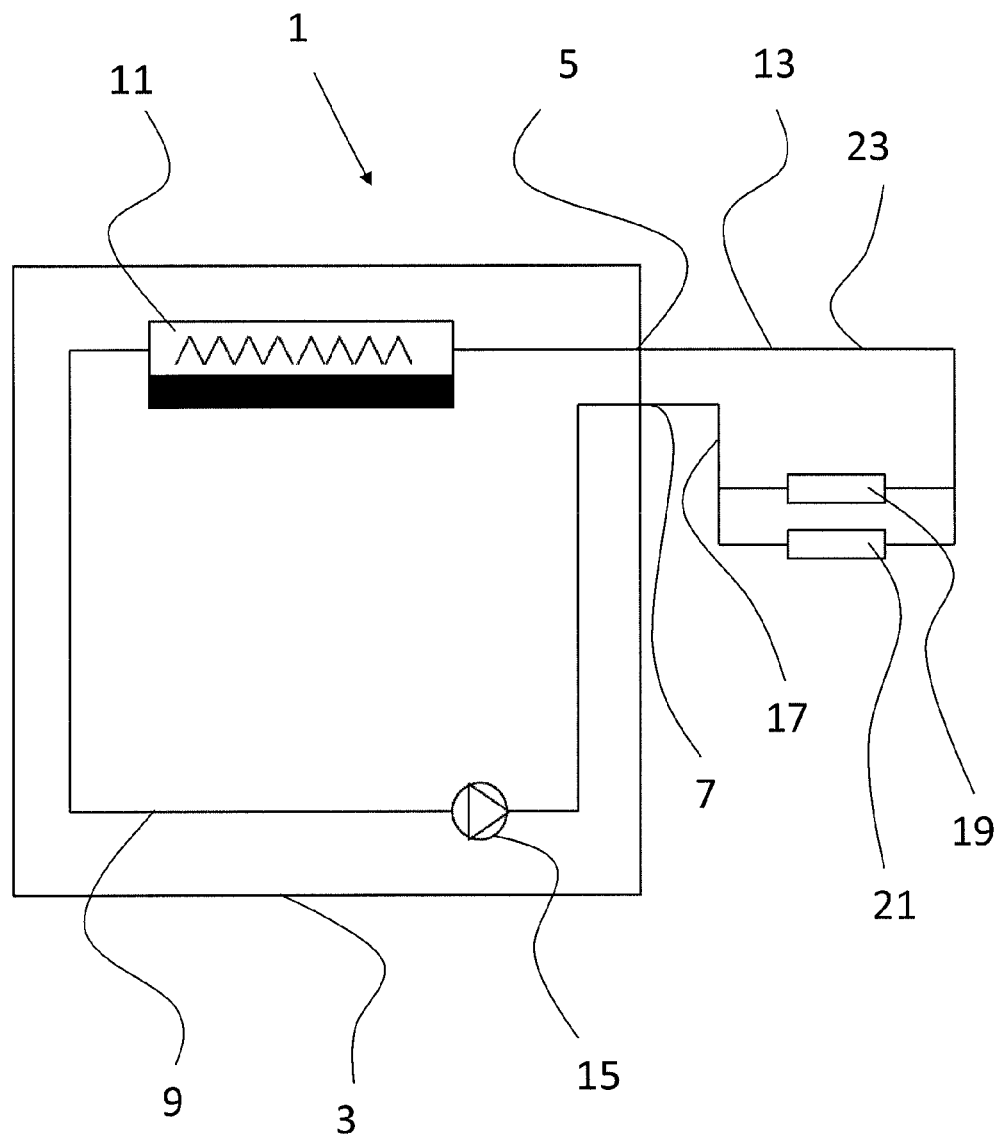
FIG. 1 shows a schematic diagram of a prior art liquid cooling system.

FIG. 1 shows a schematic diagram of a prior art liquid cooling system 1 comprising a prior art cooling unit 3, the cooling unit 3 comprising a liquid inlet 5 and a liquid outlet 7 connected by a liquid conduit 9 passing through a heat exchanger 11, where cooling liquid 13 entering the liquid inlet 5 is passed through the heat exchanger 11 where it is cooled before leaving the cooling unit 3 at the liquid outlet 7. A pump means 15 is arranged in the cooling unit 3 to pump the cooling liquid 13 from the liquid inlet 5 to the liquid outlet 7, from where the cooling liquid 13 is conveyed in a coolant conduit 17 to radio transceivers 19, 21 where the cooling liquid 13 cools the radio transceivers 19, 21 before being conveyed back to the liquid inlet 5 in a return conduit 23.

Figure 2:
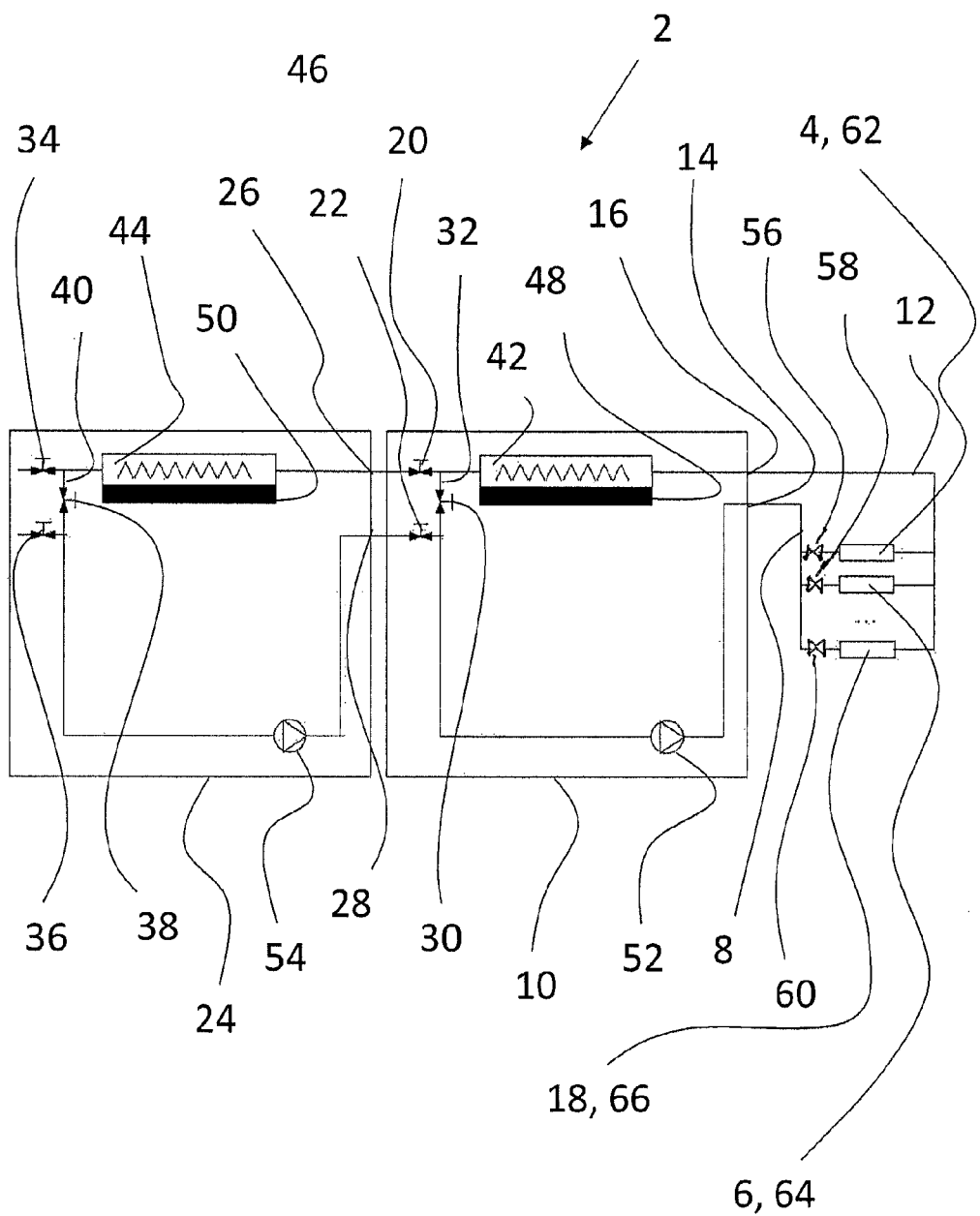
FIG. 2 shows a schematic diagram of a liquid cooling system according to the invention.

FIG. 2 shows a schematic diagram of a liquid cooling system 2 according to the invention for cooling at least one radio unit 4, 6 using liquid 8, where the liquid cooling system 2 comprises a cooling unit 10 arranged to cool the liquid 8 and further comprises a liquid loop 12 in which the liquid 8 is arranged to be conveyed from a supply outlet 14 of the cooling unit 10 to the at least one radio unit 4, 6 where the liquid 8 is arranged to cool the at least one radio unit 4, 6 before being conveyed back in the liquid loop 12 to a return inlet 16 of the cooling unit 10, the cooling unit 10 being arranged located at a distance from the at least one radio unit 4, 6. The liquid loop 12 comprises the liquid transport pathways such as conduits, hoses, channels in cold plates etc. in which the liquid 8 is transported.

When the heat load of the at least one radio unit 4, 6 to be cooled is increased, e.g. by replacing an old radio unit 4, 6 with a new having more heat load or by increasing the number of radio units to be cooled by the liquid cooling system 2 by adding a further radio unit 18 to the system, more cooling power for cooling the liquid 8 is needed, which traditionally is accomplished by replacing the old cooling unit with a new more powerful cooling unit.

According to the invention, more cooling power to the liquid cooling system 2 is provided by that the cooling unit 10 is an expandable cooling unit comprising a secondary outlet 20 and a secondary inlet 22 where, when an additional cooling unit 24 of the liquid cooling system 2 is connected with an inlet 26 to said secondary outlet 20 and with an outlet 28 to said secondary inlet 22, the liquid 8 is arranged to be fed from the cooling unit 10 through the secondary outlet 20 to the additional cooling unit 24 arranged to also cool the liquid 8 and thereafter fed back to the cooling unit 10 through the secondary inlet 22, thereby increasing the cooling power of the liquid cooling system 2.

According to the invention, seen in the direction of flow of the liquid 8, the secondary outlet 20 of the cooling unit 10 is arranged downstream of the return inlet 16 and the secondary inlet 22 of the cooling unit 10 is arranged upstream of the supply outlet 14. Further, the secondary outlet 20 is arranged upstream of the secondary inlet 22.

Preferably, a flow blocking device 30 arranged in a liquid flow pathway 32 between the secondary outlet 20 and the secondary inlet 22 in the cooling unit 10 is arranged to block said liquid flow pathway 32 inside the cooling unit 10 when said additional cooling unit 24 is connected to said cooling unit 10, thereby arranging the flow of liquid 8 between the return inlet 16 and the supply outlet 14 of the cooling unit 10 to bypass the flow blocking device 30 via the additional cooling unit 24, whereby the liquid 8 is arranged to be cooled by both the cooling unit 10 and the additional cooling unit 24 thereby increasing the cooling power of the liquid cooling system 2 by arranging an additional cooling unit 24 to cool the liquid 8 passing the return inlet 16 and the supply outlet 14 of the expandable cooling unit 10.

Preferably, the additional cooling unit 24 is also an expandable cooling unit comprising a similar secondary outlet 34 and a similar secondary inlet 36 where, when a further additional cooling unit (not shown in the figure) of the liquid cooling system 2 is connected with an inlet to said secondary outlet 34 and with an outlet to said secondary inlet 36, the liquid 8 is arranged to be fed from the additional cooling unit 24 through the secondary outlet 34 to the further additional cooling unit (not shown) arranged to also cool the liquid 8 and thereafter fed back to the additional cooling unit 24 through the secondary inlet 36, thereby further increasing the cooling power of the liquid cooling system 2.

According to the invention, seen in the direction of flow of the liquid 8, such a secondary outlet 34 of the additional cooling unit 24 is arranged downstream of the inlet 26 and such a secondary inlet 36 of the additional cooling unit 24 is arranged upstream of the outlet 28. Further, such a secondary outlet 34 is arranged upstream of such a secondary inlet 36.

Preferably, a flow blocking device 38 arranged in a liquid flow pathway 40 between the secondary outlet 34 and the secondary inlet 36 in the additional cooling unit 24 is arranged to block said liquid flow pathway 40 inside the additional cooling unit 24 when said further additional cooling unit (not shown) is connected to said additional cooling unit 24, thereby arranging the flow of liquid 8 between the return inlet 16 and the supply outlet 14 of the cooling unit 10 to bypass also the flow blocking device 38 via the further additional cooling unit (not shown), whereby the liquid 8 is arranged to be cooled by both the cooling unit 10 and the additional cooling unit 24 and the further additional cooling unit (not shown) thereby further increasing the cooling power of the liquid cooling system 2 by arranging also a further additional cooling unit (not shown) to cool the liquid 8 passing the return inlet 16 and the supply outlet 14 of the expandable cooling unit 10.

The cooling unit 10, and preferably also any additional cooling units such as e.g. the additional cooling unit 24 and a possible cooling unit (not shown) connected thereto, preferably comprises a heat exchanger 42, 44 arranged to cool the liquid 8.

In the respective heat exchanger 42, 44, the liquid 8 is preferably arranged in thermal contact with ambient air 46 arranged to cool the respective heat exchanger 42, 44, where the liquid 8 is preferably arranged to pass through channels (not shown) in the respective heat exchanger 42, 44 and the ambient air 16 is preferably arranged to be forced by a respective fan 48, 50 as a forced flow of ambient air over cooling fin surfaces (not shown) arranged in the respective heat exchanger 42, 44. Thus the liquid 8 to be cooled is cooled by the respective heat exchanger 42, 44 by that heat is transferred from the liquid 8 to the ambient air 46 by the respective heat exchanger 42, 44.

The cooling unit 10, and preferably also any additional cooling units such as e.g. the additional cooling unit 24 and a possible cooling unit (not shown) connected thereto, preferably comprises a liquid circulation device, e.g. a pump unit, 52, 54 arranged to convey the liquid 8 in the liquid loop 12, i.e. to create a liquid flow in the liquid cooling system 2. It is not necessary to arrange more than one liquid circulation device 52, 54 in the liquid cooling system 2, but it is advantageous for the following reasons: firstly, if one liquid circulation device malfunctions, and the liquid circulation device is of the type allowing liquid to still flow through the pump such as e.g. a centrifugal pump, the respective other liquid circulation devices continue to create a liquid flow in the liquid cooling system 2, and secondly, it is possible to arrange the respective additional cooling unit 24 to be of the same type as the cooling unit 10 thereby avoiding the need for manufacture of different types of cooling units. The respective liquid circulation device 52, 54 is preferably a centrifugal pump.

Thus, preferably, the respective additional cooling unit 24 is of the same type as the expandable cooling unit 10. By arranging the cooling unit 10 and the respective additional cooling unit 24 of the same type, manufacturing of a large number of cooling units is simplified as all cooling units may be arranged at all cooling unit positions in the liquid cooling system 2, and also any number of cooling units may be added to the liquid cooling system 2, thereby making it possible to increase the cooling power of the liquid cooling system 2 in a very flexible way depending on the increase of radio unit heat load.

Normally, radio units 4, 6, 18 are arranged on top of a tower or at a similar high mounting point such as a roof of a building in order to cover a large surface with the respective radio unit 4, 6, 18. The invention is especially advantageous when replacing old radio units 4, 6 arranged to be cooled by the liquid cooling system 2 or when adding new radio units 18 to be cooled by the liquid cooling system 2 by that an embodiment of the invention comprises a respective constant fluid flow valve 56, 58, 60 arranged in the liquid loop 8 at the respective radio unit 4, 6, 18 to be cooled by the liquid 8, whereby the flow of liquid 8 is kept the same for all radio units 4, 6, 18 to be cooled by the liquid 8 independent of the respective distance at which the respective radio unit 4, 6, 18 is arranged in relation to the cooling unit 10. Thus, the flow of liquid 8 in radio units arranged at very different distances from the cooling unit 10 are similar whereby differences on the cooling of the respective radio unit 4, 6, 18 due to pressure drops, due to longer length of liquid cooling conduit, in the loop 8 for a radio unit 18 arranged far away from the cooling unit 10 compared to a radio unit 4 arranged relatively close to the cooling unit 10, or separated very far from the other radio units 4, 6, is avoided. Thus all radio units 4, 6, 18 are able to receive the same cooling power independent of how far from each other or the cooling unit 10 that they are placed.

The cooling unit 10 is preferably placed where it can be easily reached for maintenance, e.g. on the ground or on a roof or in a building.

The respective constant liquid flow valve 56, 58, 60 is preferably a vortex valve. A vortex valve is a valve comprising a cavity with mainly cylindrical cross-section, where liquid can flow into the cavity at an inlet mainly tangentially at the periphery of the cavity with tangential velocity and leave the said cavity at an outlet connected to the cavity where the outlet from the cavity is arranged a shorter radial distance from the longitudinal axis of the cavity than the inlet to the cavity.

The respective radio unit 4, 6, 18 preferably comprises a respective cold plate 62, 64, 66 through which the liquid 8 is arranged to pass, preferably in channels, whereby the liquid 8 is arranged in thermal contact with the respective cold plate 62, 64, 66, where the respective cold plate 62, 64, 66 is preferably arranged in thermal contact with a heat generating part of the respective radio unit 4, 6, 18, whereby the liquid 8 is arranged in thermal contact with a heat generating part of the respective radio unit 4, 6, 18, whereby the liquid 8 is arranged to cool the respective radio unit 4, 6, 18 by that heat is transferred from a heat generating part of the respective radio unit 4, 6, 18 to the liquid 8 passing the respective cold plate 62, 64, 66.

The thermal contact may be direct i.e. via heat conductive material between a heat generating part of the respective radio unit 4, 6, 18 and the liquid 8, or indirect i.e. at least partly by radiation heat transfer through air or vacuum between a heat generating part of the respective radio unit 4, 6, 18 and the liquid 8.

The heat generating part of the respective radio unit 4, 6, 18, may e.g. be a power amplifier and/or a chip and/or a power unit.

The above mentioned respective constant liquid flow valve 56, 58, 60 is preferably arranged at the inlet to the respective cold plate 62, 64, 66.

Figure 3:
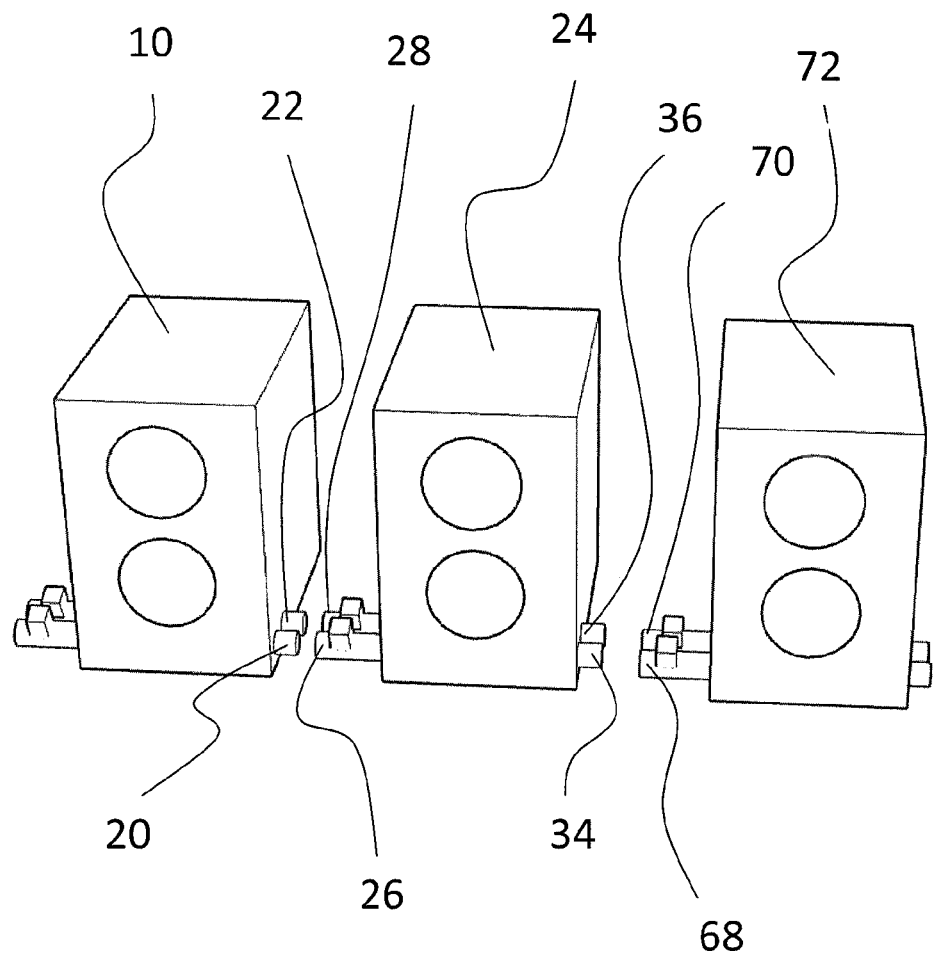
FIG. 3 shows a schematic view of several cooling units for a liquid cooling system according to the invention.

FIG. 3 shows a schematic view of several cooling units 10, 24 72 of a liquid cooling system 2 according to the invention.

According to a further embodiment of the invention, the secondary outlet 20 and the secondary inlet 22 in the cooling unit 10 and the inlet 26 and the outlet 28 in the additional cooling unit 24 are arranged as quick-coupling valves, thereby enabling a "plug-and-play" connection between the cooling unit 10 and the additional cooling unit 24.

According to a further embodiment, the secondary outlet 34 and the secondary inlet 36 in the additional cooling unit 24 and the inlet 68 and the outlet 70 in a further additional cooling unit 72 are arranged as quick-coupling valves, thereby enabling a "plug-and-play" connection between the additional cooling unit 24 and a further additional cooling unit 72. The "plug-and-play" function is achieved by that having respective quick-coupling valves, it is possible to prefill the respective additional cooling unit 24, 72 with liquid 8, thereby avoiding the need for filling up the liquid cooling system 2 with more liquid 8 after the addition of an additional liquid cooling unit 24, 72 without liquid 8 to the liquid cooling system 2.

Figure 4:
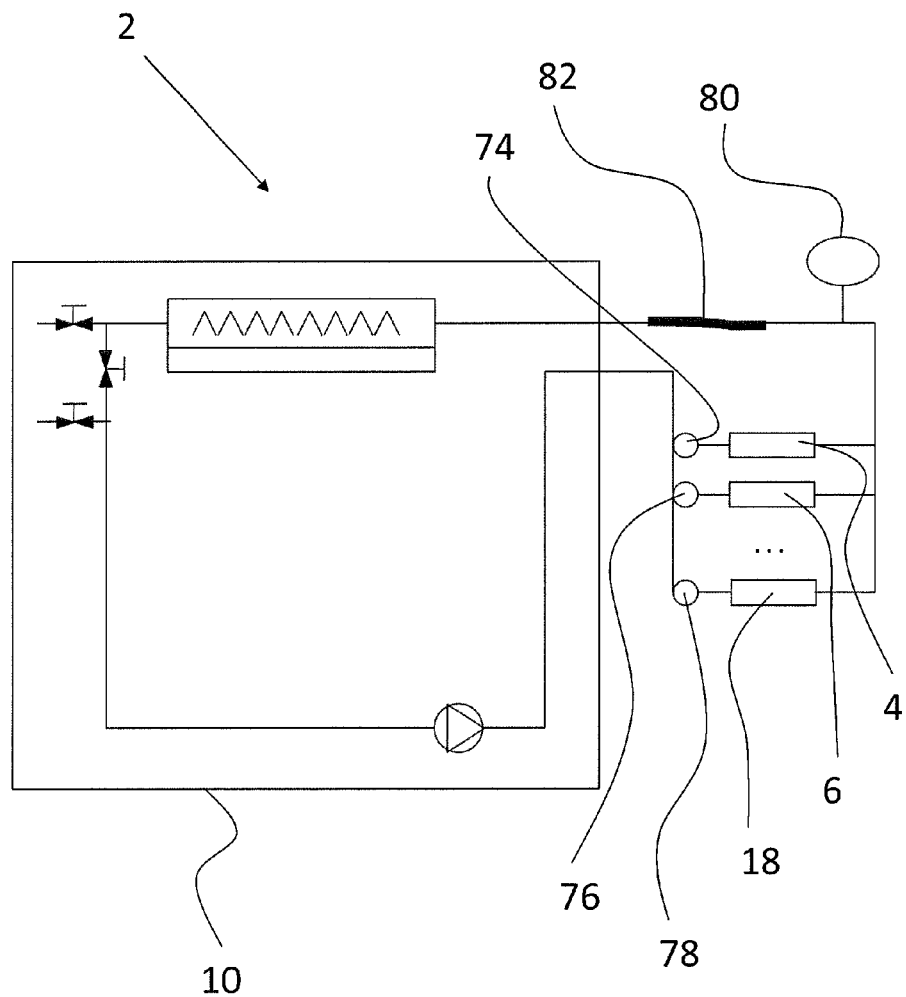
FIG. 4 shows a schematic diagram of a liquid cooling system with a liquid cooling unit and respective radio unit devices for keeping a constant volume flow according to another embodiment of the invention.

FIG. 4 shows a schematic diagram of a liquid cooling system 2 with a liquid cooling unit 10 and respective radio unit pressure devices 74, 76, 78 and an air vent 80 for keeping a constant volume flow according to another embodiment of the invention. The liquid cooling unit 10 is of the type described in connection with FIG. 2. The respective radio unit pressure device 74, 76, 78 is arranged in the liquid cooling system 2 in order to enable a "plug-and-play" replacement of a radio unit 4, 6, 18. To allow for replacement of a radio unit without having to turn off the other radio units cooled by the same cooling system is important in order to allow for traffic in at least one radio unit during replacement of another. The respective radio unit pressure device 74, 76, 78 is arranged in the loop 12, when seen in the direction of liquid flow, upstream of the respective radio unit 4, 6, 18. When a respective radio unit 4, 6, 18 is to be replaced, the respective radio unit pressure device 74, 76, 78 is activated thereby blocking the flow of liquid 8 to the respective radio unit 4, 6, 18, e.g. by applying a counter pressure to the flow in the loop 12 or by blocking the loop 12, when at the same time allowing air to enter the respective radio unit 4, 6, 18 whereby the liquid 8 i the respective radio unit 4, 6, 18 is pumped out. When air exits the air vent 80, the liquid 8 has been removed from the respective radio unit 4, 6, 18 to the loop 12 downstream of the respective radio unit 4, 6, 18 whereby the respective radio unit 4, 6, 18 may be removed and replaced, e.g. by that the respective radio unit 4, 6, 18 is connected to the loop 12 by inlet and outlet non-leak quick-coupling valves arranged at the inlet and outlet of the respective cold plate, whereafter the respective radio unit pressure device 74, 76, 78 is deactivated thereby unblocking the flow of liquid 8 to the respective radio unit 4, 6, 18 whereby the respective radio unit 4, 6, 18 is refilled with liquid 8 from the loop 12. The air vent 80 prevents air from entering the cooling unit 10. A further advantage is that no liquid 8 has to be added to the liquid cooling system 2 when replacing a radio unit 4, 6, 18 or when adding a new radio unit which is pre-filled with liquid.

Liquid cooling systems are traditionally arranged with an expansion tank in the cooling unit in order to allow for heat expansion and heat contraction of the liquid in the system. According to one embodiment of the invention, the liquid cooling system 2 comprises a soft hose 82 arranged as a part of the loop 12 and being arranged to transport liquid 8 in the loop 12, whereby any heat contraction or heat expansion of the liquid 8 results in expansion or contraction of a part of the loop 12 thus eliminating the need for an expansion tank in the cooling unit. This is advantageous, as a traditional expansion tank takes up much space in the cooling unit, whereby the cooling unit may be arranged with smaller dimensions.

Figure 5:
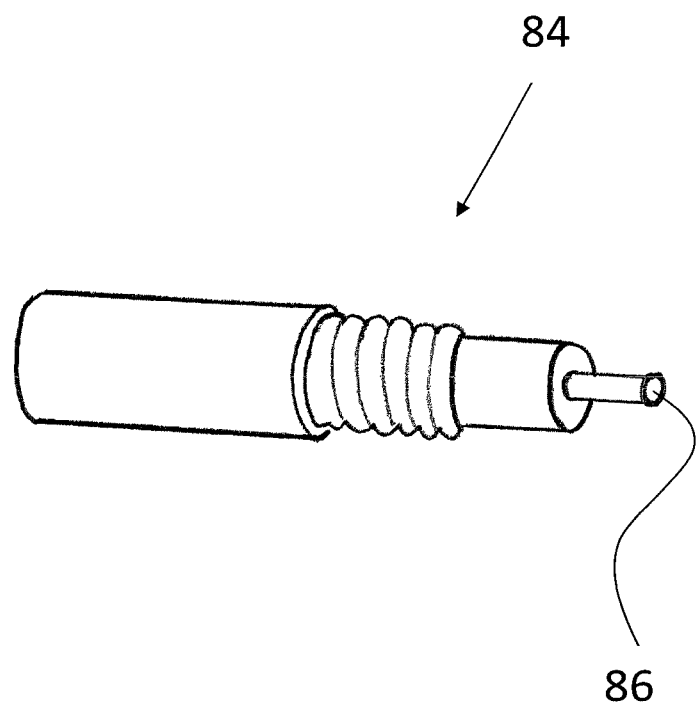
FIG. 5 shows a combined radio feeder and liquid cable for a liquid cooling system according to a further embodiment of the invention.

FIG. 5 shows a combined radio feeder and liquid cable 84 for a liquid cooling system 2 according to a further embodiment of the invention. Traditional liquid cooling systems use separate power cables and separate radio feeder cables and separate liquid coolant supply hoses and liquid coolant return hoses. When a radio unit is arranged high up in a mast, the liquid hoses add significant weight to the weight to be carried by the tower. According to an embodiment of the invention, the liquid loop 12 comprises a combined radio feeder and liquid cable 84 for transport of both radio signals and liquid 8 to the radio unit 4, 6, 18, whereby liquid 8 arranged to cool the respective radio units may be transported in the loop 12 to and from the radio units 4, 6, 18 without the need for separate liquid hoses up to and down from the respective radio unit in the tower, thus enabling a reduction of the weight load on the mast and at the same time saving space and cost for installation.

The invention also relates to a method for cooling at least one radio unit 4, 6, 18 using a liquid cooling system 2 comprising a cooling unit 10 arranged located at a distance from the at least one radio unit 4, 6, 18 and further comprising a liquid loop 12, comprising the steps of cooling the liquid 8 using the liquid cooling unit 10, conveying the cooled liquid 8 in the liquid loop 12 from a supply outlet 14 of the cooling unit 10 to the at least one radio unit 4, 6, 18, cooling the at least one radio unit 4, 6, 18 using the cooled liquid 8, conveying back the liquid 8 in the liquid loop 12 from the at least one radio unit 4, 6, 18 to a return inlet 16 of the cooling unit 10, further comprising the steps of arranging the cooling unit 10 with a secondary outlet 20 and a secondary inlet 22, connecting an additional cooling unit 24 of the liquid cooling system 2 with an inlet 26 to said secondary outlet 20 and with an outlet 28 to said secondary inlet 22, feeding the liquid 8 from the cooling unit 10 through the secondary outlet 20 to the additional cooling unit 24, cooling the liquid 8 in the additional cooling unit 24, and feeding back the liquid 8 to the cooling unit 10 through the secondary inlet 22.

The step of cooling the at least one radio unit 4, 6, 18 using the cooled liquid 8 may comprise the step of arranging a cold plate 62, 64, 66 in thermal contact with both the at least one radio unit 4, 6, 18 to be cooled and the liquid 8.

The present invention is not limited to the embodiments described above, but also relates to and incorporates all embodiments within the scope of the appended independent claim. Thus, it is possible to combine features from the embodiments described above as long as the combinations are possible.

What is claimed is:

1. A liquid cooling system comprising:
   a first cooling unit including:
      a heat exchanger arranged to cool a liquid,
      a supply outlet,
      a return inlet,
      a secondary outlet, and
      a secondary inlet;
   a liquid loop arranged to convey the liquid, having been cooled by the heat exchanger, from the supply outlet of the first cooling unit to a radio unit distanced away from the heat exchanger so that the liquid becomes in thermal contact with the radio unit to thereby cool the radio unit and is thereafter conveyed via the liquid loop to the return inlet of the first cooling unit,
      wherein the secondary outlet and the secondary inlet are connectable to a inlet and an outlet, respectively, of a second cooling unit to connect the first cooling unit to the second cooling unit so that the liquid is thereby arranged to be fed from the first cooling unit through the secondary outlet to the inlet of the second cooling unit to be cooled by the second cooling unit and thereafter fed back to the first cooling unit from the outlet of the second cooling unit through the secondary inlet of the first cooling unit, to thereby allow the liquid cooling system to be expandable from cooling with the first cooling unit to cooling with both the first cooling unit and the second cooling unit; and
   a flow blocking device arranged in the first cooling unit in a liquid flow pathway between the secondary outlet and the secondary inlet, wherein the flow blocking device is arranged to block the liquid flow pathway inside the first cooling unit when the first cooling unit is connected to the second cooling unit, whereby a flow of the liquid between the return inlet and the supply outlet of the first cooling unit is arranged to bypass the flow blocking device via the second cooling unit.

2. The liquid cooling system according to claim 1, wherein the secondary outlet of the cooling unit is arranged upstream of the secondary inlet.

3. The liquid cooling system according to claim 1, further comprising the second cooling unit,
   wherein the second cooling unit is an expandable cooling unit comprising a secondary outlet and a secondary inlet connectable to an inlet and an outlet of a third cooling unit to connect the second cooling unit to the third cooling unit so that the liquid is thereby arranged to be fed from the second cooling unit through the secondary outlet of the second cooling unit to the inlet of the third cooling unit to be cooled by the third cooling unit and thereafter fed back to the second cooling unit from the outlet of the third cooling unit through the secondary inlet of the second cooling unit,
   to thereby allow the liquid cooling system to be further expandable from cooling with both the first and second cooling units to cooling with the first, second and third cooling units.

4. The liquid cooling system according to claim 3, wherein the secondary outlet of the second cooling unit is arranged upstream of the secondary inlet of the second cooling unit.

5. The liquid cooling system according to claim 3, further comprising:
   a flow blocking device arranged in the second cooling unit in a liquid flow pathway between the secondary outlet of the second cooling unit and the secondary inlet of the second cooling unit, wherein the flow blocking device is arranged to block the liquid flow pathway inside the second cooling unit when the second cooling unit is connected to the third cooling unit, whereby a flow of the liquid between the return inlet and the supply outlet of the first cooling unit is arranged to bypass the flow blocking device via the third cooling unit.

6. The liquid cooling system according to claim 1, wherein, to be cooled by the heat exchanger, the liquid is arranged in thermal contact with ambient air arranged to cool the heat exchanger.

7. The liquid cooling system according to claim 6, wherein, to be cooled by the heat exchanger, the liquid is arranged in thermal contact with a forced flow of ambient air arranged to cool the heat exchanger.

8. The liquid cooling system according to claim 1, wherein the second cooling unit comprises a heat exchanger arranged to cool the liquid.

9. The liquid cooling system according to claim 1, wherein the first cooling unit comprises a liquid circulation device arranged to convey the liquid in the liquid loop.

10. The liquid cooling system according to claim 9, wherein the liquid circulation device is a pump.

11. A liquid cooling system comprising:
    a first cooling unit including:
       a heat exchanger arranged to cool a liquid,
       a supply outlet,
       a return inlet,
       a secondary outlet, and
       a secondary inlet;

a liquid loop arranged to convey the liquid, having been cooled by the heat exchanger, from the supply outlet of the first cooling unit to a radio unit distanced away from the heat exchanger so that the liquid becomes in thermal contact with the radio unit to thereby cool the radio unit and is thereafter conveyed via the liquid loop to the return inlet of the first cooling unit, wherein the secondary outlet and the secondary inlet are connectable to a inlet and an outlet, respectively, of a second cooling unit to connect the first cooling unit to the second cooling unit so that the liquid is thereby arranged to be fed from the first cooling unit through the secondary outlet to the inlet of the second cooling unit to be cooled by the second cooling unit and thereafter fed back to the first cooling unit from the outlet of the second cooling unit through the secondary inlet of the first cooling unit, to thereby allow the liquid cooling system to be expandable from cooling with the first cooling unit to cooling with both the first cooling unit and the second cooling unit, wherein the second cooling unit comprises a liquid circulation device arranged to convey the liquid in the liquid loop.

12. The liquid cooling system according to claim 1, wherein the second cooling unit is of the same type as the first cooling unit.

13. The liquid cooling system according to claim 1, further comprising:

a constant liquid flow valve is arranged in the liquid loop.

14. The liquid cooling system according to claim 13, wherein the constant liquid flow valve is a vortex valve.

15. The liquid cooling system according to claim 1, wherein the radio unit comprises a cold plate where the liquid is arranged in direct or indirect thermal contact with a heat generating part of the radio unit.

16. The liquid cooling system according to claim 15, wherein the heat generating part of the radio unit is a power amplifier.

17. The liquid cooling system according to claim 15, further comprising:

a constant liquid flow valve arranged at an inlet to the cold plate.

18. The liquid cooling system according to claim 1, wherein the secondary outlet and the secondary inlet of the first cooling unit and the inlet and the outlet of the second cooling unit are arranged as quick-coupling valves.

19. The liquid cooling system according to claim 3, wherein the secondary outlet and the secondary inlet of the second cooling unit and the inlet and the outlet of the third cooling unit are arranged as quick-coupling valves.

20. The liquid cooling system according to claim 15, further comprising:

a radio unit pressure device arranged in the liquid loop upstream of the radio unit.

21. The liquid cooling system according to claim 20, wherein the radio unit is arranged connected to the liquid loop by inlet and outlet non-leak quick-coupling valves arranged at an inlet and an outlet of the cold plate.

22. The liquid cooling system according to claim 1, further comprising a soft hose arranged as a part of the liquid loop.

23. The liquid cooling system according to claim 1, wherein the liquid loop comprises a combined radio feeder and liquid cable for transport of both radio signals and the liquid to the radio unit.

24. A liquid cooling system comprising:

a first cooling unit including:
 a heat exchanger arranged to cool a liquid,
 a supply outlet,
 a return inlet,
 a secondary outlet, and
 a secondary inlet;

a liquid loop arranged to convey the liquid, having been cooled by the heat exchanger, from the supply outlet of the first cooling unit to a radio unit distanced away from the heat exchanger so that the liquid becomes in thermal contact with the radio unit to thereby cool the radio unit and is thereafter conveyed via the liquid loop to the return inlet of the first cooling unit;

a second cooling unit including an inlet and an outlet, wherein the secondary outlet and the secondary inlet of the first cooling unit are connected to the inlet and the outlet, respectively, of the second cooling unit to connect the first cooling unit to the second cooling unit so that the liquid is thereby arranged to be fed from the first cooling unit through the secondary outlet to the inlet of the second cooling unit to be cooled by the second cooling unit and thereafter fed back to the first cooling unit from the outlet of the second cooling unit through the secondary inlet of the first cooling unit, to thereby allow the liquid cooling system to be expandable from cooling with the first cooling unit to cooling with both the first cooling unit and the second cooling unit, and a flow blocking device arranged in the first cooling unit in a liquid flow pathway between the secondary outlet and the secondary inlet, wherein the flow blocking device is arranged to block the liquid flow pathway inside the first cooling unit when the first cooling unit is connected to the second cooling unit, whereby a flow of the liquid between the return inlet and the supply outlet of the first cooling unit is arranged to bypass the flow blocking device via the second cooling unit.

25. The liquid cooling system according to claim 24, further comprising:

a third cooling unit including an inlet and an outlet, wherein the second cooling unit includes a secondary outlet and a secondary inlet connectable to the inlet and the outlet, respectively, of the third cooling unit to connect the second cooling unit to the third cooling unit so that the liquid is thereby arranged to be fed from the second cooling unit through the secondary outlet of the second cooling unit to the inlet of the third cooling unit to be cooled by the third cooling unit and thereafter fed back to the second cooling unit from the outlet of the third cooling unit through the secondary inlet of the second cooling unit, to thereby allow the liquid cooling system to be further expandable from cooling with both the first and second cooling units to cooling with the first, second and third cooling units.

* * * * *